US006358832B1

(12) United States Patent
Edelstein et al.

(10) Patent No.: US 6,358,832 B1
(45) Date of Patent: Mar. 19, 2002

(54) METHOD OF FORMING BARRIER LAYERS FOR DAMASCENE INTERCONNECTS

(75) Inventors: Daniel C. Edelstein, New Rochelle, NY (US); Timothy J. Dalton, Ridgefield, CT (US); John G. Gaudiello, Poughkeepsie, NY (US); Mahadevaiyer Krishnan, Hopewell Junction, NY (US); Sandra G. Malhotra, Beacon, NY (US); Maurice McGlashan-Powell, Yorktown Heights, NY (US); Eugene J. O'Sullivan, Nyack, NY (US); Carlos J. Sambucetti, Croton-on-Hudson, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/641,834

(22) Filed: Aug. 18, 2000

Related U.S. Application Data

(62) Division of application No. 09/409,244, filed on Sep. 30, 1999, now Pat. No. 6,153,935.

(51) Int. Cl.⁷ .................................................. H01L 21/44
(52) U.S. Cl. ................... 438/612; 438/618; 438/633; 438/687
(58) Field of Search ................. 438/612, 614, 438/618, 622, 624, 633, 687; 257/734, 773, 774

(56) References Cited

U.S. PATENT DOCUMENTS

| | | |
|---|---|---|
| 4,789,648 A | 12/1988 | Chow et al. |
| 4,910,169 A | 3/1990 | Hoshino |
| 4,944,836 A | 7/1990 | Beyer et al. |
| 5,447,887 A | 9/1995 | Filipiak et al. |
| 5,676,587 A | 10/1997 | Landers et al. |
| 5,708,303 A | 1/1998 | Jeng |
| 5,714,418 A | 2/1998 | Bai et al. |
| 5,736,457 A | 4/1998 | Zhao |
| 5,759,915 A | 6/1998 | Matsunaga et al. |
| 5,817,572 A | 10/1998 | Chiang |
| 5,824,599 A | 10/1998 | Schacham-Diamond et al. |
| 5,874,201 A | 2/1999 | Licata et al. |
| 5,900,672 A | 5/1999 | Chan et al. |
| 6,004,188 A | 12/1999 | Roy |
| 6,051,496 A | * 4/2000 | Jang |

OTHER PUBLICATIONS

C. W. Kaanta et al., "Dual Damascene: A ULSI Wiring Technology," Proc. ULSI Multilevel Interconnect Conference, pp. 1–9, (Jun. 1991).

D. C. Edelstein, "Copper Chip" Technology, SPIE Conference on Multilevel Interconnect Technology II, Proceedings of the SPIE, vol. 3508, pp. 8–18, (Sep. 1998).

D. Edelstein et al., Full Copper Wiring in a Sub–0.25 milli–micron CMOS ULSI Technology, Tech. Digest IEEE Internal. Elect. Devbices MTg., 99. 773–6 (1997).

J. E. Cronin, et al. "Copper/Polimide Structure with Selective $Cu_3Si/SiO_2$ Etch Stop," IBM Tech. Discl. Bull., 37(6A), pp. 53–54 (Jun. 1994).

* cited by examiner

Primary Examiner—Kevin M. Picardat
Assistant Examiner—D. M. Collins
(74) Attorney, Agent, or Firm—Ratner & Prestia; Jay H. Anderson, Esq.

(57) ABSTRACT

A damascene interconnect containing a dual etch stop/diffusion barrier. The conductive material of the damascene interconnect is capped with a conductive metal diffusion barrier cap, typically using electroless deposition, and, optionally, with a dielectric etch-stop layer. An optional chemical mechanical polish-stop layer may also be present. The different methods of the invention allow the CMP stop, reactive-ion etch stop, and metal diffusion barrier requirements of the different layers to be decoupled. A preferred conductive material is copper.

27 Claims, 6 Drawing Sheets

METHOD OF FORMING BARRIER LAYERS FOR DAMASCENE INTERCONNECTS

This application is a divisional of U.S. patent application Ser. No. 09/409,244, filed on Sep. 30, 1999, now U.S. Pat. No. 6,153,935, issued on Nov. 28, 2000.

TECHNICAL FIELD

The present invention relates to formation of multi-level interconnects in a semiconductor by the damascene process. In particular, this invention relates to the formation of diffusion barrier layers, reactive ion etch (RIE) stop layers, and chemical-mechanical polishing (CMP) stop layers for damascene interconnects.

BACKGROUND OF THE INVENTION

Metallization patterns on integrated circuits can be formed by depositing a dielectric layer, patterning the dielectric layer by photolithography and reactive ion etching (RIE) to form a groove or trench, and depositing a metal layer that fills the trench in the dielectric layer. The metal layer typically not only fills the trenches but also covers the entire semiconductor wafer. Therefore, the excess metal is removed using either chemical-mechanical polishing (CMP) or an etchback process so that only the metal in the trenches remains.

This process, called the "damascene process," forms conductors in-laid in the dielectric layer. The process avoids the problems associated with metal etching, such as lack of suitable dry-etch plasma chemistries, problems in dimension control, the formation of small gaps that are difficult to fill with the subsequent dielectric layer, and the entrapment of impurities in inter-wiring spaces. This process is described in U.S. Pat. No. 4,944,836 issued to Beyer.

The term "damascene" is derived from the name of a centuries-old process used to fabricate a type of in-laid metal jewelry first seen in the city of Damascus. In the context of integrated circuits, damascene means formation of a patterned layer imbedded on and in another layer such that the top surfaces of the two layers are coplanar. Planarity is essential to the formation of fine-pitch interconnect levels because lithographic definition of fine features is achieved using high-resolution steppers having small depths of focus. The "dual damascene" process, in which conductive lines and stud via metal contacts are formed simultaneously, is described in U.S. Pat. No. 4,789,648 issued to Chow.

As wire widths in integrated circuits continue to shrink, the electrical conductivity of the wiring material becomes increasingly more important. The material of choice since the integrated circuit art began, aluminum, is becoming less attractive than other materials, such as gold, copper, and silver, which are better conductors. In addition to possessing superior electrical conductivity, these materials are more resistant than aluminum to electromigration, a property that increases in importance as wire cross-sectional areas decrease and applied current densities increase. In particular, copper is seen as an attractive replacement for aluminum because copper offers low cost, ease of processing, lower susceptibility to electromigration, and lower resistivity.

Copper has not as yet been widely used for wiring because it has several serious disadvantages. It can diffuse rapidly into and through silicon substrates and dielectric films, such as silicon dioxide. Diffusion into an adjacent dielectric region can cause formation of a conductive path between two interconnect lines producing an electrical short. Diffusion into an adjacent silicon substrate can cause junction leakage, thereby destroying the device. Copper is easily oxidized during subsequent processing steps, but, unlike aluminum, does not have a hard, stable, self-limited native oxide. Copper also has poor adhesion to capping dielectric layers. Replacement of aluminum with copper as an interconnect material requires that these problems be overcome.

J. E. Cronin et al., "Copper/Polyimide Structure with Selective $Cu_3Si/SiO_2$ Etch Stop," IBM Tech. Discl. Bull., 37(6A), 53–54 (June, 1994), and U.S. Pat. No. 5,447,887 issued to Filipiak, each disclose formation of an intermediate copper silicide layer between a copper layer and a silicon nitride layer to improve adhesion of the copper to the silicon nitride layer. Although the copper silicide layer improves adhesion between the copper and the silicon nitride layer, however, it does not act as a diffusion barrier. Furthermore, copper silicide is thermally unstable at temperatures above about 300–350° C. and may dissociate with concomitant adhesion loss at this interface. In addition, formation of the layer consumes a portion of the underlying copper layer, and silicon dissolved in the copper increases the interconnect resistivity.

The various metal caps that have been proposed are not suitable for ultra large scale integration or ultra large scale integrated circuit (ULSI) applications because they do not have the RIE etch-stop behavior needed for etching vias from above. When finite alignment registration error is present between adjacent lithographic levels, lack of a suitable RIE etch-stop can produce via overetch, which can cause via-to-underlying via or via-to-underlying interconnect shorts. Alignment registration error is a statistical possibility in the production of multi-level interconnects and must be tolerated in a multi-level interconnect technology.

To overcome the shortcomings of existing damascene interconnects, a new interconnect is provided. An object of the present invention is to provide an improved interconnect in which the conductive material, typically copper, does not diffuse into the surrounding regions. A related object is to provide an interconnect in which conductive material is not exposed to an oxidizing atmosphere. Another object is to provide an interconnect in which the conductive material adheres to the overlying material. Still another object is to provide an interconnect that has a blanket reactive ion etch-stop.

SUMMARY OF THE INVENTION

To achieve these and other objects, and in view of its purposes, the present invention provides, in one embodiment, a structure in which the conductive material, preferably copper, is capped with a conductive reactive ion etch-stop and diffusion barrier, and the inter-metal spacings are capped with an insulating dielectric etch-stop layer that is also a chemical mechanical stop-layer. In one embodiment, the structure comprises: a substrate; a dielectric layer over the substrate; a chemical mechanical polish-stop layer over the dielectric layer; an opening in the dielectric layer and the chemical mechanical polish-stop layer; a conductive liner lining the opening; a conductive material filling the opening and in electrical contact with the conductive liner; a conductive metal diffusion barrier cap over the conductive material; and a dielectric etch-stop layer over the chemical mechanical polish stop-layer, the liner, and the metal diffusion barrier cap. The upper surface of the chemical mechanical polish-stop layer and the upper surface of the conductive material are coplanar. The conductive metal diffusion barrier cap is in contact with the conductive material.

In this structure, the conductive metal diffusion barrier cap provides adhesion improvement, corrosion protection, and electromigration resistance improvement. These advantages are achieved by bonding the conductive metal diffusion barrier cap at the surface of the conductive material, which impedes diffusion of the atoms of conductive material under electrical current stresses. The conductive material is completely encapsulated in a diffusion barrier in a manner that decouples the needs of reactive ion etch-stop, CMP-stop performance, or both from the diffusion barrier performance of the conductive metal diffusion barrier cap.

In another aspect, the invention is a method for forming the structure. The method comprises the steps of:

(A) depositing a dielectric layer on substrate;

(B) depositing a chemical mechanical polish-stop layer on the dielectric layer;

(C) forming an opening in the dielectric layer;

(D) depositing a conductive liner in the opening;

(E) depositing a conductive material in the opening:

(F) removing the excess conductive material;

(G) depositing a conductive metal diffusion barrier cap on the conductive material; and (H) depositing a dielectric etch-stop on the conductive material and dielectric layer;

in which:

in step (F) the excess liner and the excess conductive material are removed by chemical mechanical polishing; and in step (F) at least some of the chemical mechanical polish-stop layer is not removed.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures:

FIG. 2a is a block diagram showing the steps for producing the structure of FIG. 1a;

DETAILED DESCRIPTION OF THE INVENTION

Figure 1A:
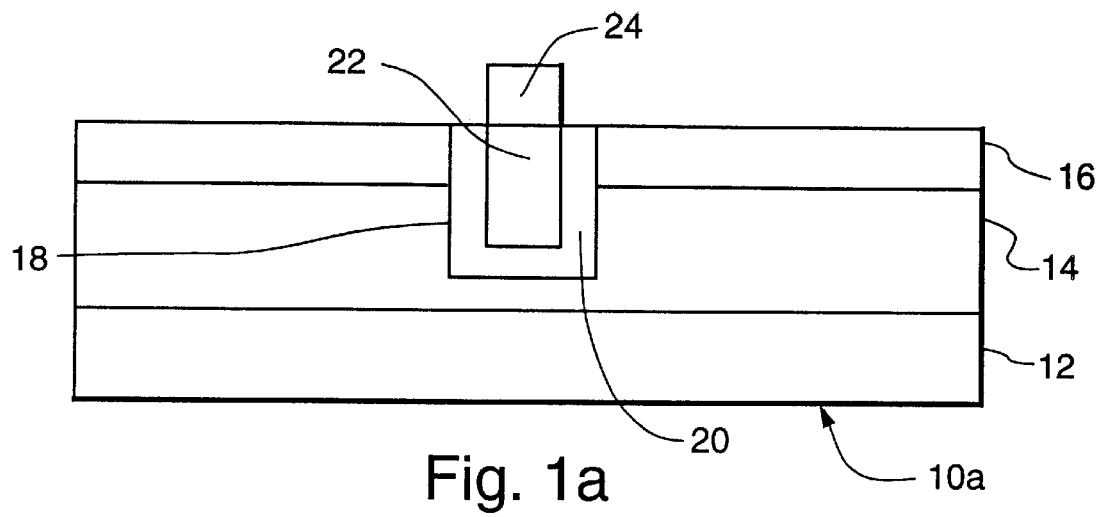
FIG. 1a is a schematic cross-section of a first embodiment of the structure of the present invention.

The invention will now be described by reference to the accompanying drawing. Throughout the specification, similar reference characters refer to similar elements in all figures of the drawing. In the drawing, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Although certain aspects of the invention will be described with respect to a structure comprising copper, the invention is not so limited. Although copper is the preferred conductive material, the structure of the invention may comprise any conductive material known in the art to form interconnects by the damascene process, such as copper, aluminum, tungsten, silver, and gold, as well as conductive mixtures and conductive alloys of these materials, such as aluminum copper [Al(Cu)] alloy.

Further, although the invention is described with respect to structures containing trenches and methods to form structures containing trenches ("single-damascene"), the invention includes structures containing both trenches and vias as well as methods to form structures containing both trenches and vias ("dual-damascene"). Multilevel structures containing vias and trenches can be formed by successive application of either the single-damascene or the dual-damascene processes, or both types of processes. For any level described with a trench, a via could be formed (either before or after formation of the trench) to form a dual-damascene recess to be lined with liner and filled with conductive material.

In one embodiment, the invention is a structure in which the conductive material, preferably copper, does not diffuse into the surrounding regions, in which the conductive material is not exposed to an oxidizing atmosphere, in which the conductive material adheres to the overlying material, and which has a partial blanket insulator thin film reactive ion etch-stop on the top surface of the intermetal dielectric between the interconnects but not above the interconnects, needed for etching vias from above.

Referring to FIG. 1a, in one embodiment the structure 10a of the present invention comprises a substrate 12, overlaid by a dielectric layer 14 and a chemical mechanical polishing (CMP)-stop layer 16. The trench 18, which extends through CMP-stop layer 16 and partially into dielectric layer 14, is lined with a conductive liner 20 and is filled with a conductive material 22. A conductive metal diffusion barrier cap 24 covers conductive material 22.

Figure 1B:
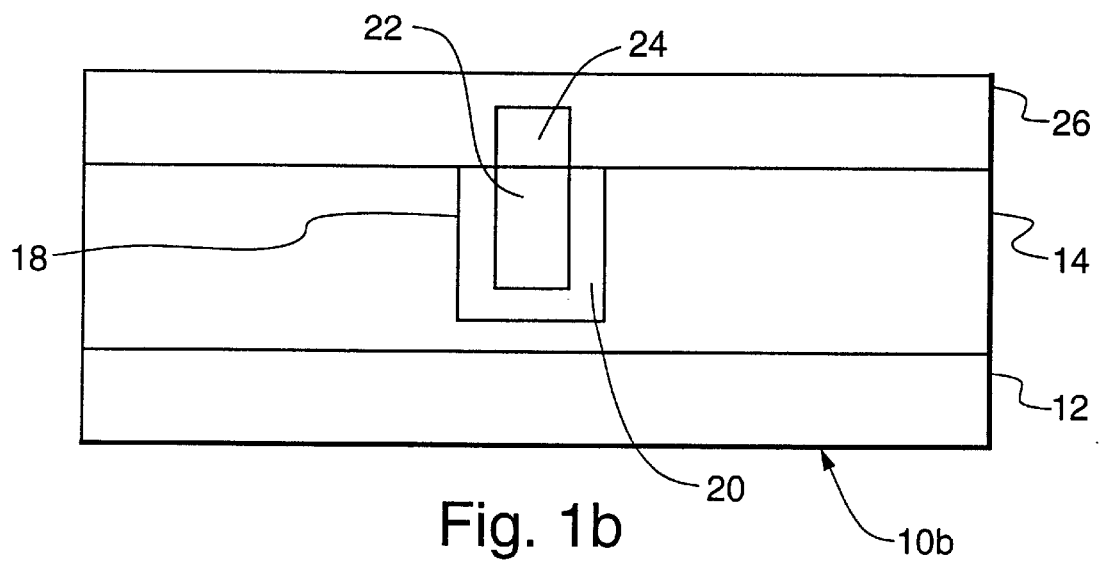
FIG. 1b is a schematic cross-section of a second embodiment of the structure of the present invention.

Referring to FIG. 1b, in another embodiment the structure 10b of the present invention comprises substrate 12, overlaid by dielectric layer 14. Trench 18 is lined with conductive liner 20 and filled with conductive material 22. Conductive metal diffusion barrier cap 24 covers conductive material 22. A dielectric etch-stop layer 26 covers dielectric layer 14, conductive material 20, and conductive metal diffusion barrier cap 24.

Figure 1C:
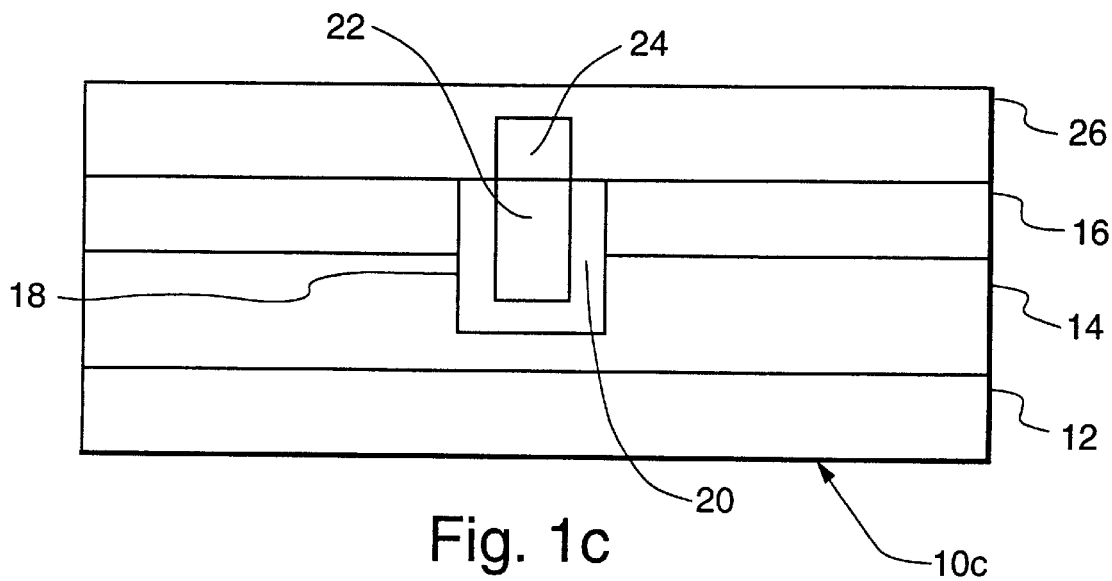
FIG. 1c is a schematic cross-section of a third embodiment of the structure of the present invention.

Referring to FIG. 1c, in a third embodiment the structure 10c of the present invention comprises substrate 12, overlaid by dielectric layer 14 and CMP-stop layer 16. Trench 18 is lined with conductive liner 20 and is filled with conductive material 22. Conductive metal diffusion barrier cap 24 covers conductive material 22. Dielectric etch-stop layer 26 covers conductive material 20, conductive metal diffusion barrier cap 24, and CMP-stop layer 16 (and, hence, indirectly, dielectric layer 14).

Figure 2A:
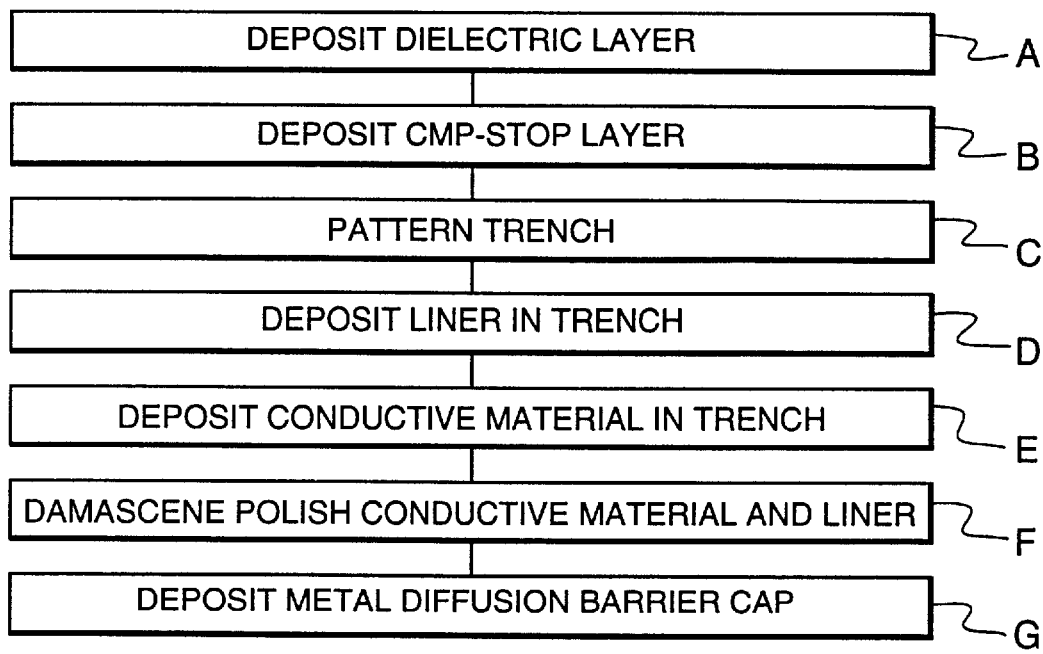

FIG. 2a shows, in block diagram form, the steps for formation of the structure 10a shown in FIG. 1a. Initially, in steps A–F, damascene wires are formed in substrate 12 by conventional techniques well known to those skilled in the art. These techniques are described in, for example, U.S. Pat. No. 4,944,836 issued to Beyer and U.S. Pat. No. 4,789,648 issued to Chow, both of which are incorporated in this application by reference.

Figure 3:
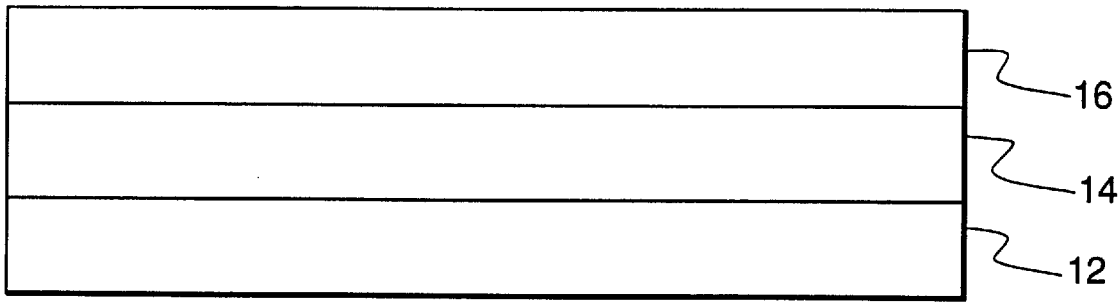
FIG. 3 is a cross-section of a substrate with a dielectric layer and a CMP-stop layer formed on the substrate.

Referring to FIG. 3, substrate 12 comprises a semiconductor material, typically doped, single-crystal silicon and polycrystalline silicon. Substrate 12 may have already been subjected to a variety of processes associated with the formation of integrated circuits and may additionally comprise structures formed by these processes. These structures are not shown in FIGS. 1 and 3–9.

In step A, dielectric (insulator) layer 14 is formed (typically deposited) on a planar surface of semiconductor substrate 12. Dielectric layer 14 consists of silicon dioxide, polyimide, an organic siloxane polymer, poly-arylene ether, carbon-doped silicate glass or silsesquioxane glass, spin-on glass, fluorinated or non-fluorinated silicate glass, diamond-like amorphous carbon, or any similar low dielectric constant material known in the art to be useful as a dielectric material. Dielectric layer 14 can be deposited by chemical vapor deposition (CVD) including plasma-enhanced chemical vapor deposition (PECVD), physical vapor deposition (PVD), or spin coating. The thickness of dielectric layer 14 is the sum of the desired metal thickness and the underlying dielectric thickness, typically about 0.3 to about 2.0 microns.

In step B, CMP-stop layer 16 is deposited on top of dielectric layer 14. CMP-stop layer 16 is a thin (about 20 to about 100 nm thick) layer of a dielectric silicon-based compound of low dielectric constant such as silicon nitride or silicon carbide, or a silicon-containing material of lower dielectric constant such as hydrogenated silicon carbide, silicon oxynitride, or a non-silicon-containing polymer such as one derived from benzocyclobutene. CMP-stop layer 16 is blanket-deposited by any process known in the art for depositing thin dielectric layers, such as CVD, spin-on, evaporation, sputtering, and the like. The resulting structure, following step B, is shown in FIG. 3.

Figure 4:
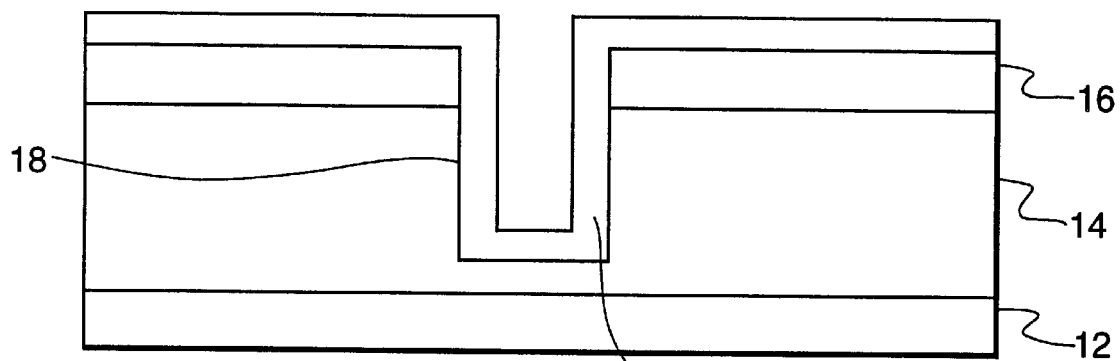
FIG. 4 is a cross-section of a structure comprising a trench and a conductive liner.

Referring to FIG. 4, in step C an opening is formed in CMP-stop layer 16 and dielectric layer 14 using techniques well known to those skilled in the art. The opening may be either a trench or a via. Trench 18 is shown in FIG. 4 for purposes of example. Trench 18 is a recess, or groove, of any arbitrary shape, which penetrates through CMP-stop layer 16 and may penetrate partially through dielectric layer 14. CMP-stop layer 16 and dielectric layer 14 are preferably patterned using photo-lithography and etched using reactive ion etching to form trench 18. Typically, photoresist (not shown) is deposited on CMP-stop layer 16. The photoresist is patterned, the pattern is transferred to the underlying layers, and the photoresist is stripped. Trench 18 typically has a depth of about 0.2 microns to about 1.0 micron. A coincident via may also be formed that intersects this interconnect. The via height is generally less than 2 microns, typically about 0.2 microns to about 1.0 micron.

Alternatively, a via, which extends completely to substrate 12 so that conductive material deposited in the trench 18 is in electrical contact with the underlying layer, may be formed. To form a via, a separate masking step is performed to pattern a square or small rectangular opening (as viewed from above), which may coincide with part of the interconnect trench 18. The opening is etched downward to the underlying level or substrate 12 to form a via.

After the opening, either a trench 18 or a via, has been formed and the walls cleared, the walls are protected by, in step D, depositing a conductive liner 20 that prevents diffusion of the conductive material into substrate 12 and dielectric layer 14. Conductive liner 20 may be a layer or series of layers. Liner 20 may comprise, for example, titanium nitride, tungsten nitride, titanium tungstide, or tantalum nitride. The variations in the metallurgy and complexity of conductive liner 20 will depend on the method that will be used to fill the trench 18 and via with conductive material and the conductive material chosen. As disclosed in European Patent No. 0,715,566, conductive liner 20 may comprise a thin layer of tantalum nitride, followed by a thin layer of tantalum, and then a copper seed layer. Conductive liner 20 may be deposited by methods well known in the art, such as chemical vapor deposition (CVD) or physical vapor deposition (PVD) including ionized physical vapor deposition (IPVD). Conductive liner 20 typically has an overall thickness of about 0.02 to about 0.2 microns. Conductive liner 20 can be used to line the walls of either vias or trenches. The resulting structure, following step D, is shown in FIG. 4.

Figure 5:
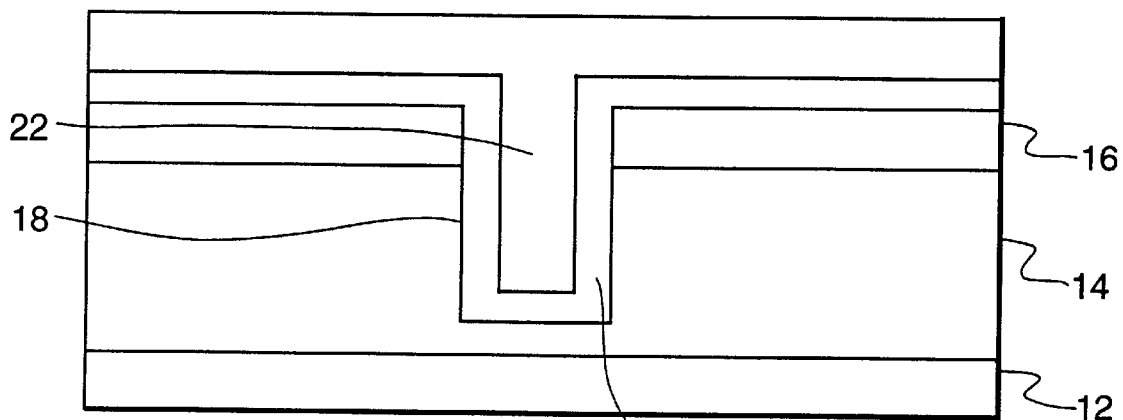
FIG. 5 is a cross-section of a structure in which the trench been filled with conductive material.

Referring to FIG. 5, in step E conductive material 22 is deposited over conductive liner 20 to a depth sufficient to ensure that trench 18 is filled with conductive material. The conductive material 22 may be deposited by any method known in the art for conductive material deposition, such as evaporation, sputtering, CVD, electroless deposition, or electroplating. The resulting structure, following step E, is shown in FIG. 5.

Figure 6:
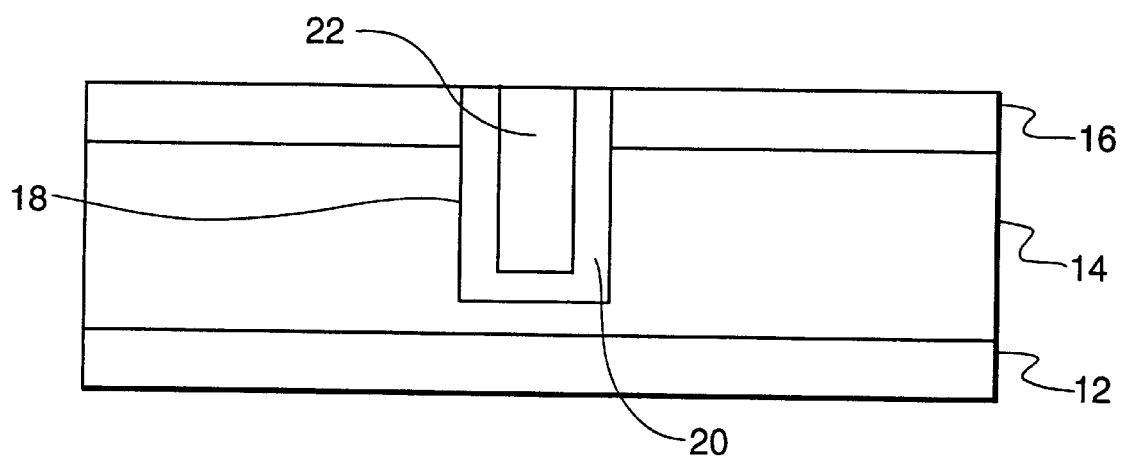
FIG. 6 is a cross-section of a structure in which the excess conductive material has been removed.

Because conductive liner 20 and conductive material 22 typically not only fill the trench 18 but also cover the entire surface of CMP-stop layer 16 (and, hence, indirectly cover the entire surface of dielectric layer 14), it is necessary to remove the excess material from the surface of CMP-stop layer 16. Referring to FIG. 6, in step F the excess material is removed using either CMP or an etch-back process so that the conductive material remains only in trench 18 (and not over the surface of CMP-stop layer 16). The resulting structure, following step F, is shown in FIG. 6.

CMP and slurries for use in CMP are disclosed, for example, in U.S. Pat. No. 4,944,836 issued to Beyer. A suitable polishing slurry for CMP of conductive materials comprises an abrasive such as alumina, silica, ceria, and/or titania, in an acidic, basic, or neutral medium such as dilute nitric acid, sulfuric acid, phosphoric acid, ammonium hydroxide, or potassium hydroxide. The polishing slurry may also comprise an oxidizing agent such as hydrogen peroxide, peracetic acid, sodium persulfate, ceric ammonium sulfate, ammonium persulfate, sodium iodate, potassium iodate, and ammonium iodate. Corrosion inhibitors, such as thioureas, thiols, ammonium xanthate, and 2,2'-dipyridyl may be present as well as surfactants, such as sodium lauryl sulfate. Typically the polishing slurry has a pH in the range of 1.0 to 7.0 and has the following composition: 0.1 to 15% by weight of an abrasive selected from the group consisting of alumina, silica, and ceria; 0.1 to 30 g/L of an oxidizer selected from the group consisting of hydrogen peroxide and ceric ammonium sulfate; 0.1 to 2 g/L of a surfactant selected from the group consisting of anionic, cationic, and non-ionic surfactants; and 0.01 to 3 g/L of a corrosion inhibitor selected from the group consisting of thioureas, thiols, ammonium xanthate, and 2,2'-dipyridyl.

The slurry removes the conductive liner 20 and the conductive material 22 much faster than it removes CMP-stop layer 16 (or dielectric layer 14) Typically, CMP removes the excess conductive liner 20 and the excess conductive material 22, but does not remove all the CMP-stop layer 16. Typically, at least some of the CMP-stop layer 16 remains after the CMP-polishing step F. Following CMP polishing, the top (exposed) surface of CMP-stop layer 16 is typically flush (i.e., coplanar) with the top (exposed) surface of conductive material 22 and the top (exposed) surface of conductive liner 20. CMP-stop layer 16 is adjacent to, but not concurrent with or on top of, conductive material 22.

A selective, two-step CMP process is disclosed in U.S. Pat. No. 5,676,587 issued to Landers, incorporated in this application by reference. In this process, the conductive material 22 and the conductive liner 20 are removed in two different steps. In the first step, the conductive material 22 and part of the conductive liner 20 are removed by CMP with a relatively abrasive, conventional, alumina-based slurry. The first polishing step is stopped after the conductive material 22 is completely removed but before the conductive liner 20 is completely removed. The remainder of the conductive liner 20 is removed by a second CMP process using a neutral, silica-based slurry that is selective for the liner material.

Figure 7:
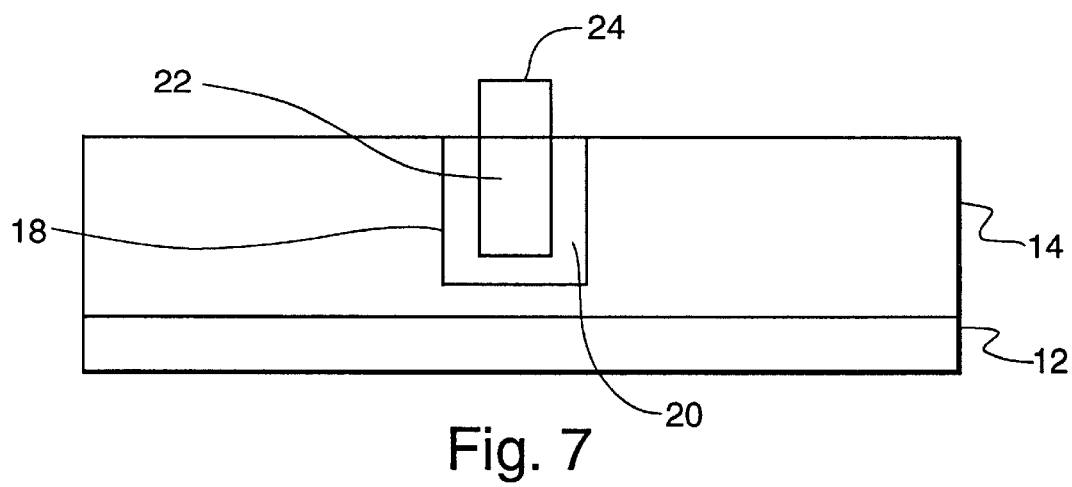
FIG. 7 is a cross-section of a structure which does not comprise a CMP-stop.

Referring to FIG. 1a, in step G, the conductive material 22 is capped with conductive metal diffusion barrier cap 24. Conductive metal diffusion barrier cap 24 is deposited selectively on the surface of the conductive material 22, preferably copper, by a self-aligned process of electroless, immersion-electroless, or selective CVD. The process selectively deposits conductive metal diffusion barrier cap 24 on the exposed surface of the conductive material 22, i.e, only on the exposed surface of the conductive material 22. The resulting structure, following step G, is shown in FIG. 7. Depending on the type of material used for the conductive metal diffusion barrier cap 24 and its method of deposition, the conductive metal diffusion barrier cap 24 may also be deposited on the upper surface of the conductive liner 20.

Electroless deposition, in which the surface of substrate 12 is exposed to a heated solution of a chemical deposition system, is well known in the art. It consists of the following process steps. A dilute acid solution is used to remove residual oxides of copper from the surface of the copper. The copper surface on which electroless deposition is desired is treated with a solution containing a noble metal salt (palladium, rhodium, ruthenium, etc.), which activates the copper surface for subsequent electroless plating. This activation is self-aligning: only the exposed copper is rendered catalytically active to electroless plating. Residual ionic or metallic residue from the activation step is removed from the surface of substrate 12 by an aqueous solution of a strong complexing agent or agents (ethylenediamine, citrate, ethylenediamine tetraacetic acid, etc.).

The substrate 12 is then exposed to the chemical deposition system, which deposits a self-aligned metallic layer on the surface of the activated copper. Although room temperature deposition is known, deposition is typically conducted at an elevated temperature, typically 50° C. to 90° C., preferably 65° C. to 75° C. The chemical deposition system comprises salts of one or more metals, complexed by an appropriate complexing agent or agents so that the solution is stable; a reducing agent for the one or more metals; and a buffer system to maintain pH.

When conductive metal diffusion barrier cap 24 is deposited by immersion-electroless deposition, the cap 24 replaces part of conductive material 22 instead of being formed on top of it. Tin, palladium, or indium may be deposited by immersion-electroless deposition. For example, immersion-electroless deposition baths are commercially available for the deposition of tin and of palladium on copper. The inventors have found that an aqueous immersion-electroless deposition bath can be used to deposit indium on copper. The aqueous deposition bath typically contains about 12–20 mL/L of concentrated sulfuric acid ($H_2SO_4$), about 40–80 g/L of thiourea, and about 8–20 g/L of indium chloride ($InCl_3$). The operating temperature range is about 40–60° C. At this temperature, a 20–40 nm thick layer of indium can be deposited on copper in about 3 to 5 minutes. Tungsten may be deposited by selective chemical vapor deposition.

In addition to preventing conductive material diffusion, the material used to form metal diffusion barrier cap layer 24 must be conductive, must have good adhesion to the surface of the conductive material 22, must not affect the resistivity of the underlying conductive material 22, and must be compatible with the further steps needed to complete formation of the integrated circuit, including subsequent interlevel dielectric deposition, and reactive ion etch-stopping of subsequent via etch through this added interlevel dielectric. Typical conductive metal diffusion barrier materials are Ni—P, Co—P, Ni—B, Co—B, Pd, and, preferably Co(W)—P and Co(W)—B, all of which possess good diffusion barrier properties for copper, and excellent adhesion to copper and to many dielectric materials. The composition of conductive metal diffusion barrier cap 24 can range from a metal (palladium, tin, indium, tungsten), to metallic phosphides (Ni—P, about 6% phosphorus), to co-metallic phosphides (Co(W)—P), about 92% cobalt, 2% tungsten, and 6% phosphorus). The thickness of conductive metal diffusion barrier cap 24 will depend on the material selected, but in general it should be about 5 to 100 nm. The bottom surface of conductive metal diffusion barrier cap 24 (the surface in contact with the upper surface of conductive material 22) is flush (coplanar) with the upper surface of conductive material 22.

Figure 2B:
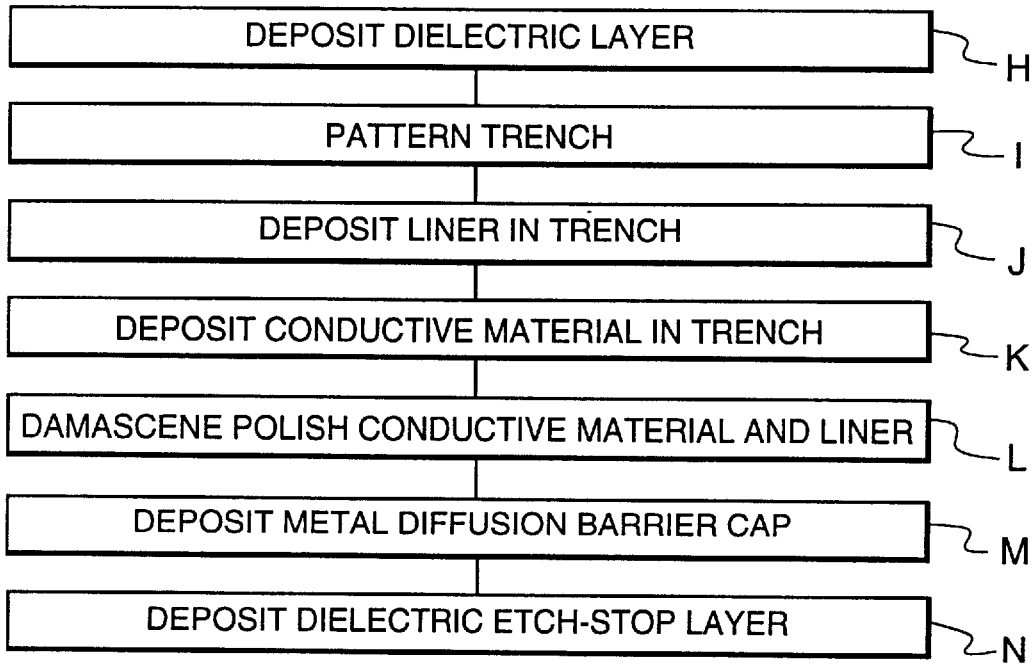
FIG. 2b is a block diagram showing the steps for producing the structure of FIG. 1b.

In the method shown in FIG. 2b, which produces the structure shown in FIG. 1b, CMP-stop layer 16 is omitted and reactive ion etch-stop 26 is added after the electroless deposition of conductive metal diffusion barrier cap 24. In steps H–K, dielectric layer 14 is deposited on substrate 12 (step H), trench 18 is formed in the dielectric layer 14 (step I), the walls of the trench 18 are protected with conductive liner 20 (step J), and the trench 18 is filled with conductive material 22 (step K), using the methods described above. Steps H, I, J, and K correspond to steps A, C, D, and E, respectively, in FIG. 2a. In steps L and M of FIG. 2b, which correspond to steps F and G of FIG. 2a, respectively, excess conductive material 22 is removed and conductive metal diffusion barrier cap 24 is deposited as described above to produce the structure shown in FIG. 7.

In step N of FIG. 2b, dielectric reactive etch-stop layer 26 is deposited over conductive metal diffusion barrier cap 24, the upper surface of conductive liner 20, and the upper surface of dielectric layer 14 to produce the structure shown in FIG. 1b. Reactive ion etch-stop 26 is a thin (about 20 to about 50 nm thick) layer of a dielectric, silicon-based compound of low dielectric constant, such as silicon nitride. Etch-stop 26 is blanket-deposited by any process known in the art for depositing thin dielectric layers, such as CVD, evaporation, sputtering, etc.

When a via is formed above etch-stop 26 in the formation of multi-level structures, etch-stop 26 is used to stop the long, first step RIE drilling down from above. A second, shorter RIE using a different reactive gas mixture is used to open etch-stop 26 only within the via hole. Typical reactive gases are fluorocarbons such as $CF_4$, $CHF_3$, $CH_3F$, $C_2F_6$, and $C_4F_8$, carbon monoxide, argon, oxygen, and nitrogen. In this manner, the conductive metal diffusion barrier cap 24 and conductive material 22 are protected until the last step (the photoresist can be removed before the last step without oxidizing or contaminating the conductive material 22). Any over-etch depth past etch-stop 26 (e.g., down the sidewall of the conductive material 22 for a slightly misaligned via) can be limited to a much lower amount because over-etch will be a fraction of the second, short etch step.

Figure 2C:
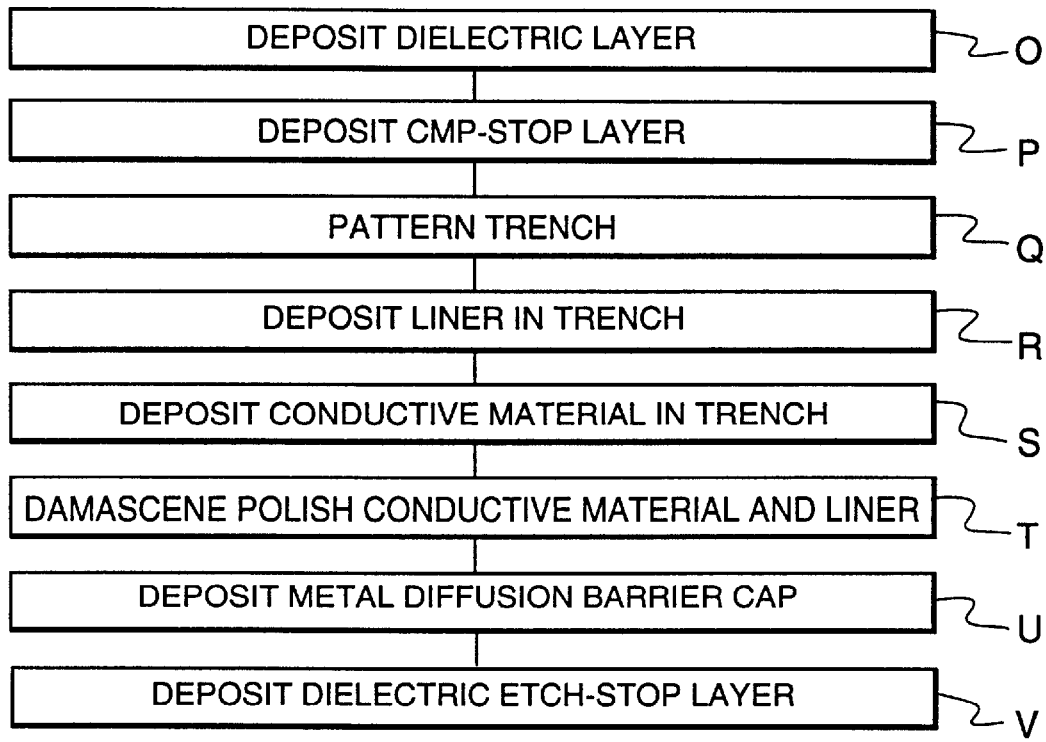
FIG. 2c is a block diagram showing the steps for producing the structure of FIG. 1c.

In the method shown in FIG. 2c, which produces the structure 10c shown in FIG. 1c, the process sequence shown in FIG. 1a is conducted and reactive ion etch-stop 26 is added after the electroless deposition of metal diffusion barrier cap 24. In steps O–S, dielectric layer 14 is deposited on substrate 12 (step O), CMP-st op layer 16 is deposited on top of dielectric layer 14 (step P), trench 18 is formed in the dielectric layer 14 and CMP-stop layer 16 (step Q), the walls of the trench 18 are protected with conductive liner 20 (step R), and the trench 18 is filled with conductive material 22 (step S), using the methods described above. Steps O, P, Q, R, and S correspond to steps A, B, C, D, and E, respectively, in FIG. 2a. In steps T and U, excess conductive material 22 is removed (step T) and conductive metal diffusion barrier cap 24 is deposited (step U) as described above in steps F and G, respectively of FIG. 2a to produce the structure shown in FIG. 1a. In step V of FIG. 2c, etch-stop layer 26 is deposited over conductive metal diffusion barrier cap 24, the upper surface of conductive liner 20, and the upper surface of CMP-stop layer 16 to produce the structure 1Oc shown in FIG. 1c.

Figure 8A:
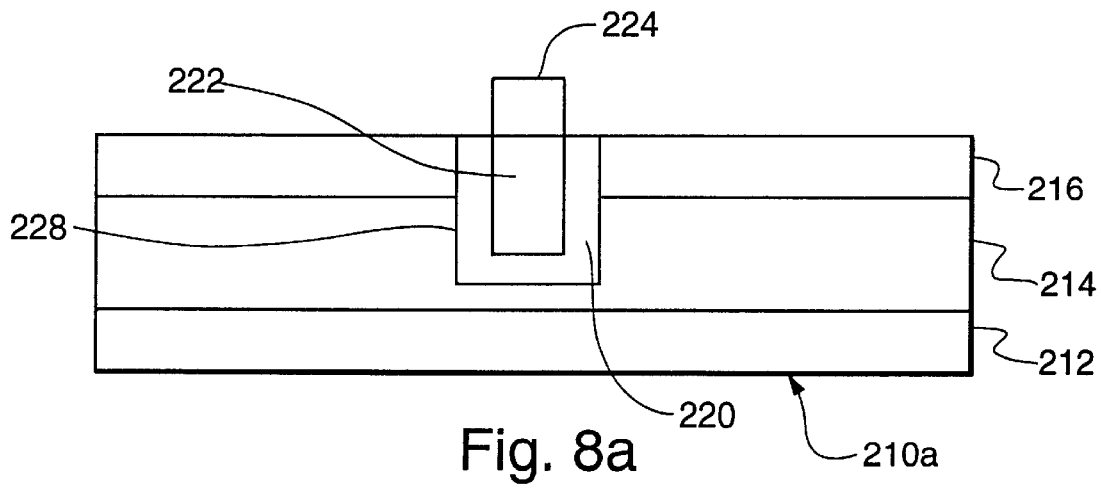
FIG. 8a is a schematic cross-section of another embodiment of a structure of the present invention.
Figure 8B:
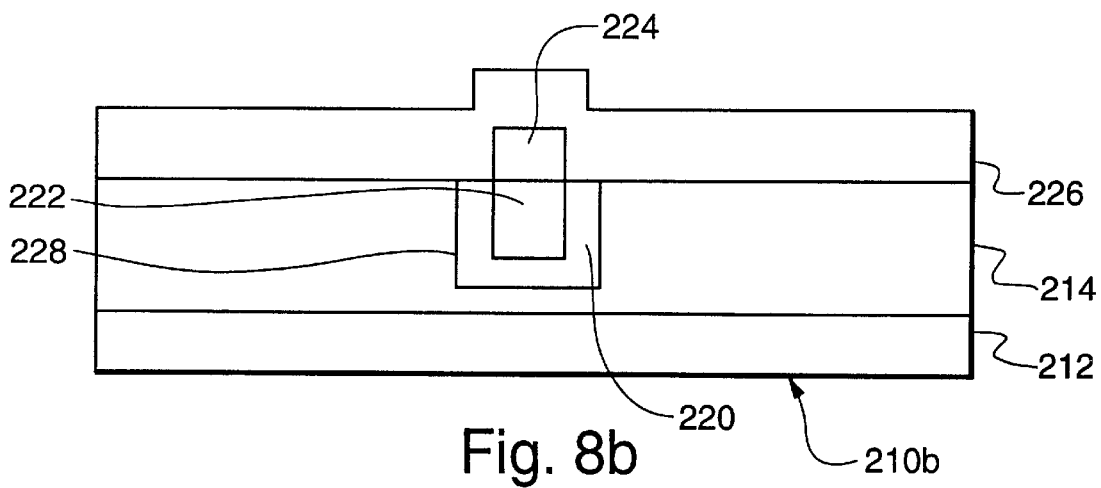
FIG. 8b is a schematic cross-section of still another embodiment of a structure of the present invention.
Figure 8C:
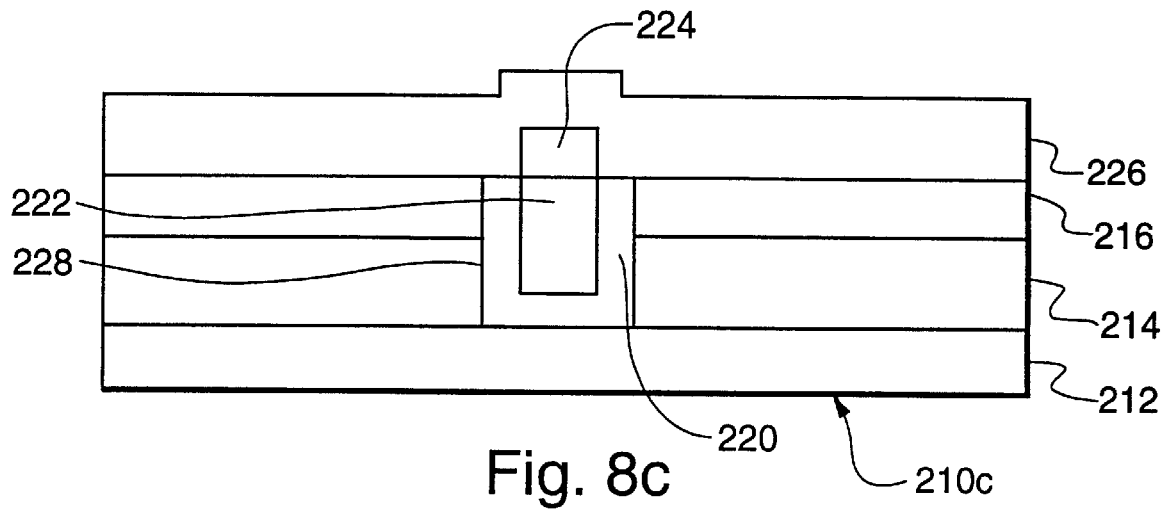
FIG. 8c is a schematic cross-section of a further embodiment of a structure of the present invention.

FIG. 8a, FIG. 8b, and FIG. 8c are schematic cross-sections of additional embodiments of structures of the present invention, in which vias are present. Referring to FIG. 8a, in one embodiment the structure 210a comprises a substrate 212, overlaid by a dielectric layer 214 and a chemical mechanical polishing (CMP)-stop layer 216. A via 228 is lined with a conductive trench (and via) liner 220 and is filled with a conductive material 222. A conductive metal diffusion barrier cap 224 covers conductive material 222.

Referring to FIG. 8b, in another embodiment the structure 210b of the present invention comprises substrate 212 overlaid by dielectric layer 214. Via 228 is lined with conductive liner 220 and is filled with conductive material 222. Conductive metal diffusion barrier cap 224 covers conductive material 222. A dielectric etch-stop layer 226 covers dielectric layer 214, conductive liner 220, and conductive metal diffusion barrier cap 224.

Referring to FIG. 8c, in a third embodiment the structure 210c of the present invention comprises substrate 212, overlaid by dielectric layer 214 and CMP-stop layer 216. Via 228 is lined with conductive liner 220 and filled with conductive material 222. Conductive metal diffusion barrier cap 224 covers conductive material 222. Dielectric etch-stop layer 226 covers CMP-stop layer 216 (and, hence, indirectly covers dielectric layer 214), conductive liner 220, and conductive metal diffusion barrier cap 224. In each of these structures 210a, 210b, and 210c, the via 228 is in electrical contact with the underlying layer (i.e., substrate 212).

The different methods of the present invention allow the requirements of the different layers to be decoupled. In the method shown in FIG. 2a, CMP-stop layer 16 must act as both a CMP stop and a reactive-ion etch stop during subsequent processing. CMP-stop layer 16 need not be a copper diffusion barrier, however, so long as conductive metal diffusion barrier cap 24 is a copper diffusion barrier. In the methods shown in FIG. 2b and FIG. 2c, conductive metal diffusion barrier cap 24 need not be a diffusion barrier and/or an etch stop, as long as reactive ion etch-stop 26 is a diffusion barrier and/or an etch stop. In these two methods, however, if metal diffusion barrier cap 24 is a diffusion barrier, reactive ion etch-stop 26 need not be a diffusion barrier. Because the requirements vary with the process sequence (method) changes, different materials can be used with different process sequences. The adhesion requirements of the different layers differ depending on which material they are in immediate contact with, so the use of different process sequences allows for additional choices of materials.

For example, silicon dioxide (dielectric constant of about 4) could be used in place of $Si_3N_4$ (dielectric constant of about 7) as a reactive ion etch-stop (for low-k polymer- or carbon-based interlevel dielectric) if it did not also have to be a copper diffusion barrier (silicon dioxide is not an effective copper diffusion barrier; $Si_3N_4$ is an effective copper diffusion barrier). Because of the lower dielectric constant of silicon dioxide, its use would help to reduce the wiring parasitic capacitance. Alternatively, if either the conductive metal diffusion barrier cap or the reactive ion etch-stop did not have to be a copper diffusion barrier as well, it might be possible to use a thinner layer of material, provided adequate reactive ion etch-stop behavior was maintained. This would also serve to lower the parasitic capacitance.

The sequence of steps can be repeated level after level on the same substrate until a multilayer structure is fabricated. The same sequence of steps can be repeated for each level or different sequences can be used to form different levels. The methods of the invention can also be combined with other methods for the levels of multi-level devices well known to those skilled in the art to form multi-level devices.

Figure 9:
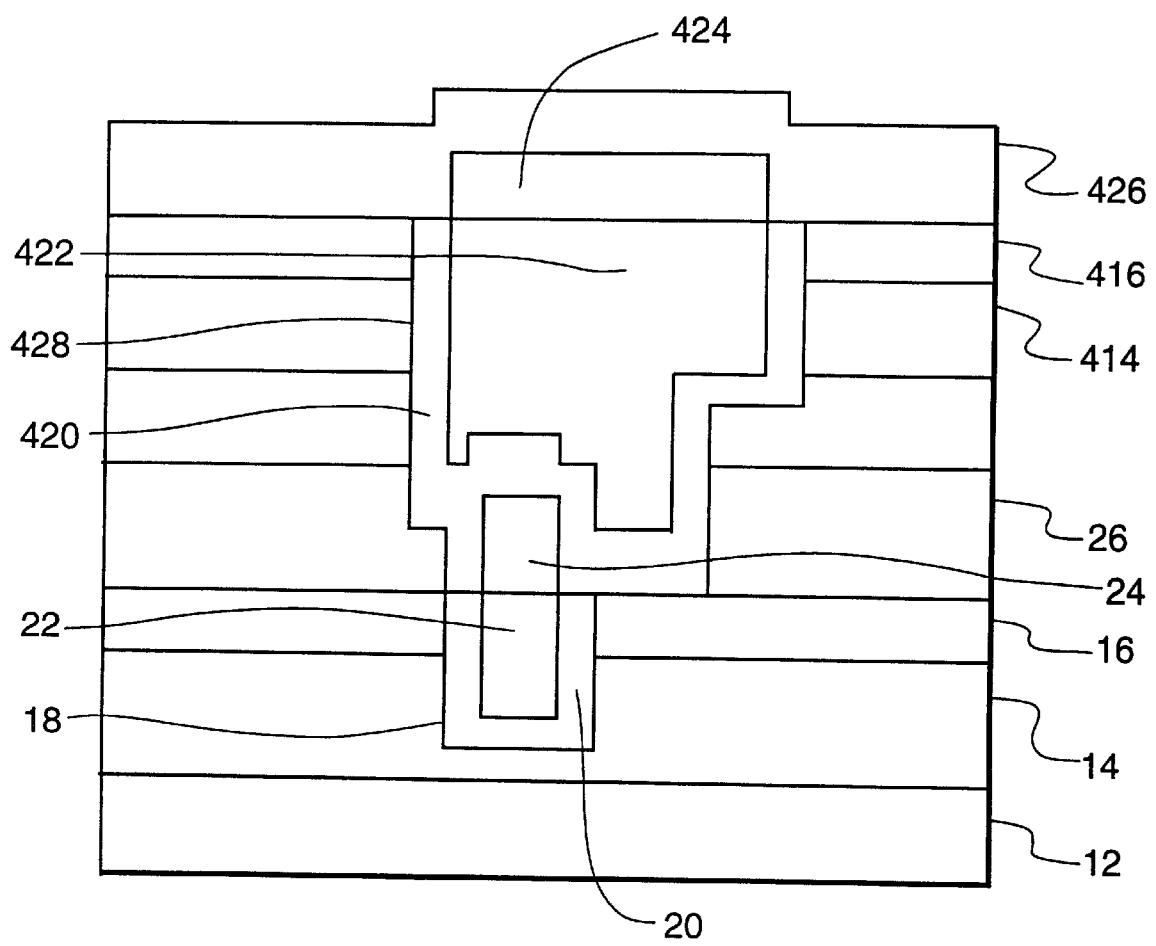
FIG. 9 is a cross-section of a multi-level structure formed using the methods of the present invention.

For example, FIG. 9 shows a structure in which an additional level has been added to the structure shown in FIG. 1c. A dielectric layer 414 is deposited on reactive ion etch-stop 26, a CMP-stop layer 416 is deposited on top of dielectric layer 414, and a via 428 is formed in the dielectric layer 414 and CMP-stop layer 416. Although via 428 is shown as extending to and making electrical contact with the underlying layer, the invention is not so limited. A trench, which does not extend to and make electrical contact with the underlying layer, can be present in the additional level.

After reactive ion etch-stop 26 is opened to expose conductive metal diffusion barrier cap 24, the walls of via 428 are protected with a conductive liner 420, and the via 428 is filled with a conductive material 422, using the methods described above. Excess conductive material 422 is removed and a conductive metal diffusion barrier cap 424 and an etch-stop layer 426 are deposited to produce the structure shown in FIG. 9.

Industrial Applicability

The present invention can be used in the manufacture of semiconductor devices, which are used in, for example, digital computers. Although the present invention has been particularly shown and described with reference to the preferred embodiments, those skilled in the art will appreciate that various modifications and changes in form and details may be made without departing from the spirit and scope of the invention. For example, in the preceding description specific details are set forth to provide a more thorough understanding of the invention, but it will be apparent to those skilled in the art that the invention may be practiced without using these specific details. Having described the invention, we now claim the following and their equivalents.

What is claimed is:

1. A method comprising the steps of:
   (A) depositing a dielectric layer on a substrate;
   (B) depositing a chemical mechanical polish-stop layer on the dielectric layer;
   (C) forming an opening through the chemical mechanical polish-stop layer and at least partially in the dielectric layer;
   (D) depositing a conductive liner in the opening;
   (E) depositing a conductive material in the opening:
   (F) removing excess liner and excess conductive material by chemical mechanical polishing, with at least some of the chemical mechanical polish-stop layer remaining and not removed; and
   (G) depositing a conductive metal diffusion barrier cap on the conductive material.

2. The method of claim 1 in which the conductive material is copper.

3. The method of claim 2 in which the opening is a trench.

4. The method of claim 2 in which the opening is a via.

5. The method of claim 2 in which the conductive metal barrier cap is deposited by electroless deposition.

6. The method of claim 2 in which the conductive metal barrier cap is deposited by immersion-electroless deposition.

7. The method of claim 1 in which the conductive metal diffusion barrier cap is deposited selectively on the surface of the conductive material.

8. The method of claim 1 additionally comprising, after step (G), the step of (H) depositing a dielectric etch-stop on the conductive material and dielectric layer.

9. The method of claim 8 in which the conductive material is copper.

10. The method of claim 9 in which the opening is a trench.

11. The method of claim 9 in which the opening is a via.

12. The method of claim 9 in which the conductive metal barrier cap is deposited by electroless deposition.

13. The method of claim 9 in which the conductive metal barrier cap is deposited by immersion-electroless deposition.

14. The method of claim 8 in which the conductive metal diffusion barrier cap is deposited selectively on the surface of the conductive material.

15. A method comprising the steps of:
   (A) depositing a dielectric layer on a substrate;
   (B) forming an opening in the dielectric layer;
   (C) depositing a conductive liner in the opening;
   (D) depositing a conductive material in the opening:
   (E) removing the excess liner and the excess conductive material by chemical mechanical polishing, with at least some of the dielectric layer remaining and not removed;
   (F) depositing a conductive metal diffusion barrier cap on the conductive material; and
   (G) depositing a dielectric etch-stop on the conductive material and dielectric layer.

16. The method of claim 15 in which the conductive material is copper.

17. The method of claim 16 in which the opening is a trench.

18. The method of claim 16 in which the opening is a via.

19. The method of claim 16 in which the conductive metal barrier cap comprises one of Co(W)—P and Co(W)—B.

20. The method of claim 16 in which the conductive metal barrier cap comprises one of tin, palladium, and indium.

21. The method of claim 15 in which the conductive metal diffusion barrier cap is deposited selectively on the surface of the conductive material.

22. A structure made by the method of claim 1.

23. The structure of claim 22 in which the conductive material is copper.

24. An structure made by the method of claim 8.

25. The structure of claim 24 in which the conductive material is copper.

26. A structure made by the method of claim 15.

27. The structure of claim 26 in which the conductive material is copper.

* * * * *